(12) United States Patent
Chen

(10) Patent No.: US 12,453,029 B2
(45) Date of Patent: Oct. 21, 2025

(54) DISPLAY DEVICE

(71) Applicant: Qisda Corporation, Taoyuan (TW)

(72) Inventor: Chun-Ting Chen, Taoyuan (TW)

(73) Assignee: Qisda Corporation, Taoyuan (TW)

( * ) Notice: Subject to any disclaimer, the term of this patent is extended or adjusted under 35 U.S.C. 154(b) by 191 days.

(21) Appl. No.: 18/156,353

(22) Filed: Jan. 18, 2023

(65) Prior Publication Data

US 2023/0380078 A1 Nov. 23, 2023

(30) Foreign Application Priority Data

May 17, 2022 (CN) .......................... 202210541383.8

(51) Int. Cl.
*H05K 5/10* (2025.01)
*G06F 1/16* (2006.01)

(52) U.S. Cl.
CPC ............. *H05K 5/10* (2025.01); *G06F 1/1601* (2013.01)

(58) Field of Classification Search
CPC .. H05K 5/0004; H05K 5/0217; G06F 1/1637; G02F 1/133308
See application file for complete search history.

(56) References Cited

U.S. PATENT DOCUMENTS

| | | | | |
|---|---|---|---|---|
| 6,593,979 B1 * | 7/2003 | Ha | ................... | G02F 1/133308 349/56 |
| 9,720,269 B2 * | 8/2017 | Jung | ................... | G02B 6/0088 |
| 9,964,787 B2 * | 5/2018 | Takemoto | ............ | G02B 6/0093 |
| 10,698,244 B2 * | 6/2020 | Yamamoto | ........ | G02F 1/133308 |
| 10,866,356 B2 * | 12/2020 | Wu | ....................... | G02B 6/0088 |
| 2004/0090560 A1 * | 5/2004 | Jang | ................... | G02F 1/133308 348/836 |
| 2010/0188597 A1 * | 7/2010 | Koike | ............... | G02F 1/133308 361/829 |
| 2012/0236541 A1 * | 9/2012 | Chen | ................. | G02F 1/133308 312/223.1 |
| 2013/0069500 A1 * | 3/2013 | Chan | ................. | G02F 1/133308 312/223.1 |
| 2013/0235277 A1 * | 9/2013 | Suwa | ................... | H05K 5/0221 348/725 |
| 2014/0347595 A1 * | 11/2014 | Mori | ................. | G02F 1/133308 349/58 |
| 2015/0362787 A1 * | 12/2015 | Yuan | ................. | G02F 1/133308 349/58 |

(Continued)

FOREIGN PATENT DOCUMENTS

CN 201383290 1/2010
CN 105430306 3/2016

*Primary Examiner* — Sagar Shrestha

(57) ABSTRACT

A display device, including a main casing and a display assembly, is provided. The main casing has a hook, a position-limiting pillar, and a position-limiting block. The position-limiting block is adjacent to the position-limiting pillar. The display assembly includes a frame and a display panel. The frame has a side wall, and the hook is located behind the side wall in a front-rear direction of the display device and is engaged with the frame. The position-limiting pillar penetrates the display assembly along the front-rear direction, and the position-limiting block leans against the display assembly along the front-rear direction. The display panel is disposed in the frame, and the side wall surrounds a periphery of the display panel.

16 Claims, 6 Drawing Sheets

(56) References Cited

U.S. PATENT DOCUMENTS

| | | | |
|---|---|---|---|
| 2016/0057872 A1* | 2/2016 | Park | G02B 6/0083 |
| | | | 361/752 |
| 2017/0168345 A1* | 6/2017 | Wu | G02F 1/133308 |
| 2017/0292691 A1* | 10/2017 | Coo | H05K 7/20436 |
| 2017/0315408 A1* | 11/2017 | Lee | G02F 1/133605 |
| 2017/0363798 A1* | 12/2017 | Hirayama | G02B 6/0036 |
| 2019/0293986 A1* | 9/2019 | Kil | G02F 1/1333 |

* cited by examiner

DISPLAY DEVICE

CROSS-REFERENCE TO RELATED APPLICATION

This application claims the priority benefit of China application serial no. 202210541383.8, filed on May 17, 2022. The entirety of the above-mentioned patent application is hereby incorporated by reference herein and made a part of this specification.

BACKGROUND

Technical Field

The invention relates to a display device, and particularly relates to a display device using a main casing to engage a display assembly.

Description of Related Art

In order to save manufacturing and assembling costs, some displays omit configuration of a middle frame, and directly use a main casing to engage a display assembly. Under such configuration, in order to avoid the display assembly from being separated from the main casing due to deformation of the main casing, a thickness of the main casing needs to be increased so as to have sufficient structural rigidity. However, this makes it difficult to deform the main casing, which increases difficulty of disassembling the display assembly, and the disassembling process is likely to cause the display panel to crack.

SUMMARY

The invention is directed to a display device, in which a display assembly is easy to be disassembled and a display panel is prevented from being cracked during a disassembling process.

The invention provides a display device including a main casing and a display assembly. The main casing has a hook, a position-limiting pillar, and a position-limiting block, and the position-limiting block is adjacent to the position-limiting pillar. The display assembly includes a frame and a display panel. The frame has a side wall, and the hook is located behind the side wall in a front-rear direction of the display device and is engaged with the frame. The position-limiting pillar penetrates the display assembly along the front-rear direction, and the position-limiting block leans against the display assembly along the front-rear direction. The display panel is disposed in the frame, and the side wall surrounds a periphery of the display panel.

In an embodiment of the invention, the display panel has a display surface, the front-rear direction is perpendicular to the display surface, and the display surface faces a front of the display device in the front-rear direction.

In an embodiment of the invention, the frame has an engaging portion, and the engaging portion is located behind the side wall in the front-rear direction and is engaged with the hook.

In an embodiment of the invention, the hook is located on an outer side of the engaging portion.

In an embodiment of the invention, the hook has a first appearance surface, the side wall has a second appearance surface, and the first appearance surface and the second appearance surface extend along the front-rear direction and are flush with each other.

In an embodiment of the invention, one end of the hook abuts against the side wall.

In an embodiment of the invention, the hook has a notch at the end, and the notch is adjacent to the side wall.

In an embodiment of the invention, the main casing includes a rear casing portion and a side casing portion, the rear casing portion shields a back surface of the display assembly, the side casing portion extends from a periphery of the rear casing portion to the side wall, and the hook is formed on the side casing portion.

In an embodiment of the invention, the display assembly includes a back plate, the back plate is connected to the frame and is located between the frame and the main casing, the back plate has a position-limiting hole, the position-limiting pillar penetrates the position-limiting hole along the front-rear direction, and the position-limiting block leans against the back plate along the front-rear direction.

The invention provides a display device including a main casing and a display assembly. The main casing has a hook. The display assembly has a position-limiting protrusion, where the position-limiting protrusion extends into the main casing along a front-rear direction of the display device. The display assembly includes a frame and a display panel. The frame has a side wall, and the hook is located behind the side wall in the front-rear direction and is engaged with the frame. The display panel is disposed in the frame, the side wall surrounds a periphery of the display panel, and the position-limiting protrusion does not overlap with a display area of the display panel in the front-rear direction.

In an embodiment of the invention, the display panel has a display surface, the front-rear direction is perpendicular to the display surface, and the display surface faces a front of the display device in the front-rear direction.

In an embodiment of the invention, the frame has an engaging portion, and the engaging portion is located behind the side wall in the front-rear direction and is engaged with the hook.

In an embodiment of the invention, the hook is located on an outer side of the engaging portion.

In an embodiment of the invention, the hook has a first appearance surface, the side wall has a second appearance surface, and the first appearance surface and the second appearance surface extend along the front-rear direction and are flush with each other.

In an embodiment of the invention, one end of the hook abuts against the side wall.

In an embodiment of the invention, the hook has a notch at the end, and the notch is adjacent to the side wall.

In an embodiment of the invention, the main casing includes a rear casing portion and a side casing portion, the rear casing portion shields a back surface of the display assembly, the side casing portion extends from a periphery of the rear casing portion to the side wall, and the hook is formed on the side casing portion.

In an embodiment of the invention, the main casing has a position-limiting groove, and the position-limiting protrusion extends into the position-limiting groove along the front-rear direction.

In an embodiment of the invention, the main casing has a position-limiting block, the position-limiting groove is formed on the position-limiting block, and the position-limiting block leans against the display assembly along the front-rear direction.

In an embodiment of the invention, the display assembly includes a back plate, the back plate is connected to the frame and is located between the frame and the main casing, and the position-limiting protrusion is formed on the back plate.

Based on the above descriptions, in the display device of the invention, the side wall surrounding the display panel is added to the frame of the display assembly, and the hook of the main casing is located behind the side wall and is not adjacent to the display panel. Thereby, when the user uses a dismantling tool to exert a force on the hook to separate the hook from the display assembly, the dismantling tool functions on a position between the hook of the main casing and the side wall of the frame without contacting the display panel, so as to prevent the display panel from being cracked due to the function of the dismantling tool. In addition, positions of the main casing and the display assembly may be mutually limited by the adjacent position-limiting pillar and position-limiting block, or positions of the display assembly and the main casing may be mutually limited by the position-limiting protrusion located adjacent to the hook. Accordingly, the rigidity of the overall structure may be increased, and the display assembly may be prevented from being separated from the main casing due to deformation of the main casing, so that it is not necessary to design the main casing to have a larger thickness in order to increase the rigidity of the main casing.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
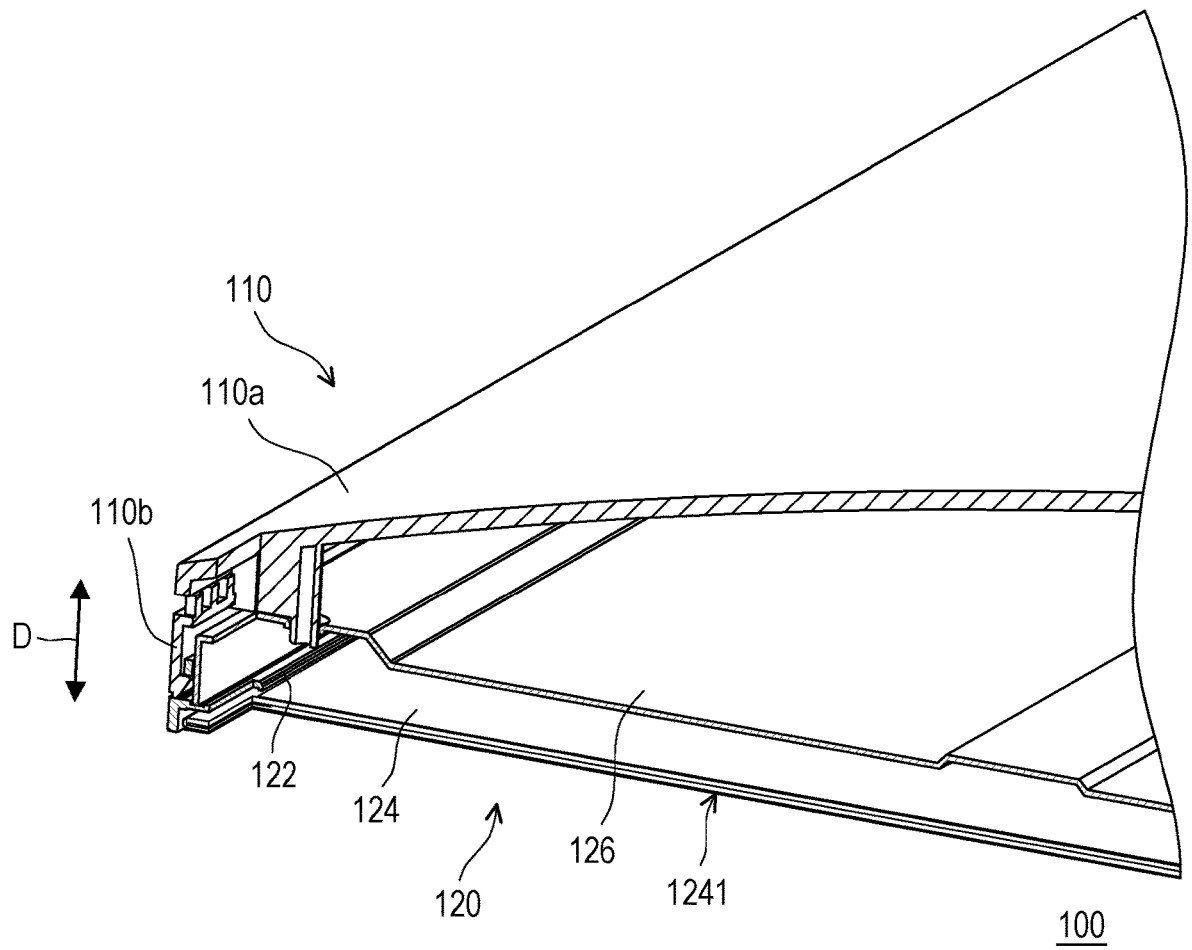
FIG. 1 is a three-dimensional view of some components of a display device according to an embodiment of the invention.

FIG. 1 is a three-dimensional view of some components of a display device according to an embodiment of the invention. Referring to FIG. 1, a display device 100 of the embodiment includes a main casing 110 and a display assembly 120. The main casing 110 includes a rear casing portion 110a and a side casing portion 110b connected to each other, and the rear casing portion 110a shields a back surface of the display assembly 120. The display assembly 120 includes a frame 122, a display panel 124 and a back plate 126. The frame 122 is, for example, a plastic frame, the display panel 124 is, for example, a liquid crystal display panel and is disposed in the frame body 122, and the back plate 126 is connected to the frame body 122 by means of engaging or other suitable means and is located between the frame 122 and the main casing 110. The display panel 124 has a display surface 1241, a front-rear direction D of the display device 100 is perpendicular to the display surface 1241, and the display surface 1241 faces the front of the display device 100 in the front-rear direction D.

Figure 2:
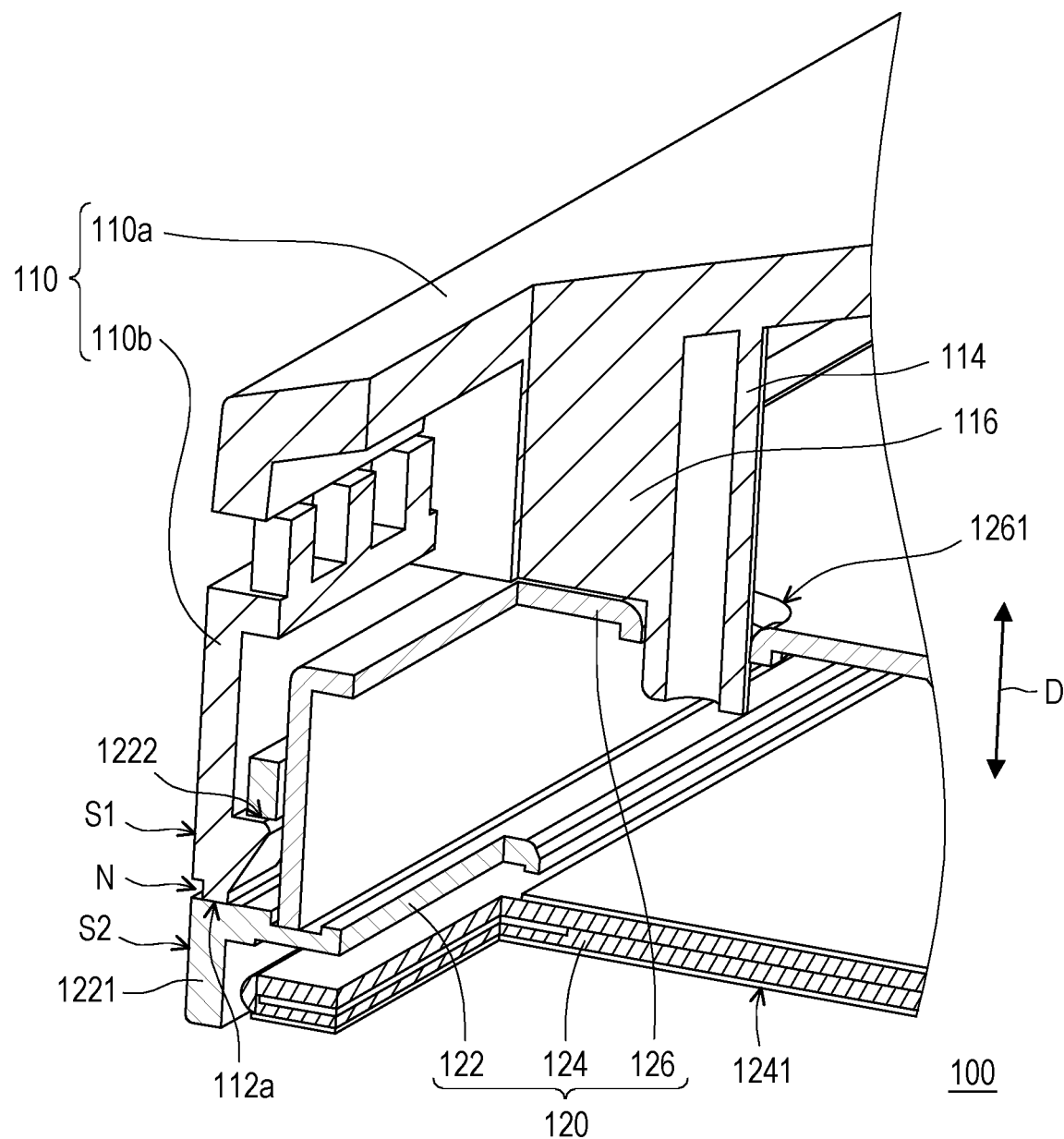
FIG. 2 is a partial enlarged view of the display device of FIG. 1.
Figure 3:
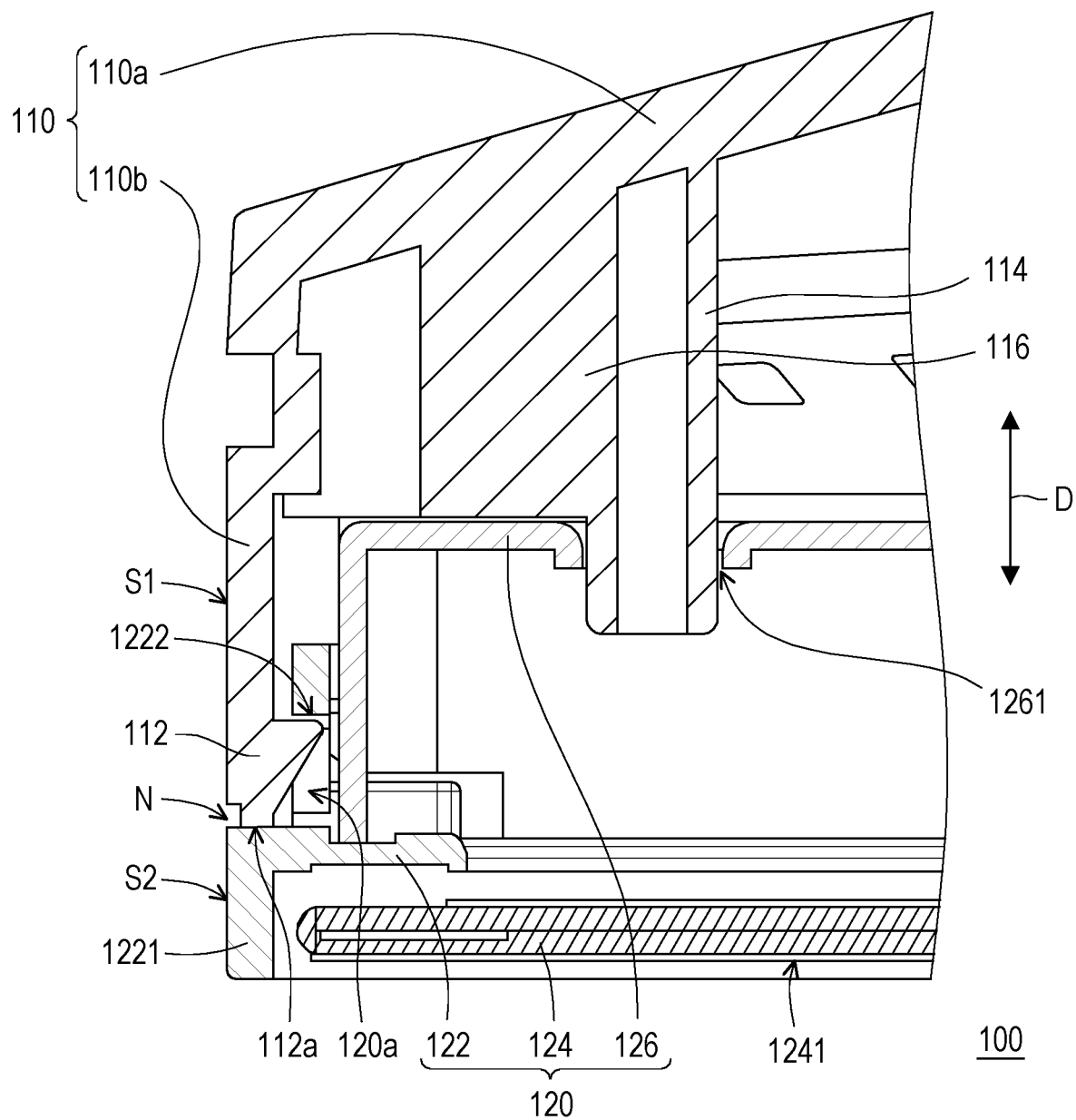
FIG. 3 is a partial cross-sectional view of the display device of FIG. 1.

FIG. 2 is a partial enlarged view of the display device of FIG. 1. FIG. 3 is a partial cross-sectional view of the display device of FIG. 1. Referring to FIG. 2 and FIG. 3, the main casing 110 of the embodiment has a hook 112, a position-limiting pillar 114 and a position-limiting block 116, and the position-limiting block 116 is adjacent to the position-limiting pillar 114. The frame 122 has a side wall 1221 and an engaging portion 1222. The engaging portion 1222 is, for example, an inner wall of an engaging groove 120a (marked in FIG. 3) of the frame 122. The side casing portion 110b of the main casing 110 extends from a periphery of the rear casing portion 110a to the side wall 1221 of the frame 122, the hook 112 is formed on the side casing portion 110b, and the side wall 1221 surrounds a periphery of the display panel 124. The engaging portion 1222 of the frame 122 and the hook 112 of the main casing 110 are located behind the side wall 1221 in the front-rear direction D of the display device 100, and the hook 112 extends into the engaging groove 120a and is engaged with the engaging portion 1222. The back plate 126 of the display assembly 120 has a position-limiting hole 1261, the position-limiting pillar 114 of the main casing 110 penetrates the position-limiting hole 1261 of the back plate 126 along the front-rear direction D, and the position-limiting block 116 of the main casing 110 leans against the back plate 126 of the display assembly 120 along the front-rear direction D.

As described above, in the embodiment, a side wall 1221 surrounding the display panel 124 is added to the frame 122 of the display assembly 120, and the hook 112 of the main casing 110 is located behind the side wall 1221 and is not adjacent to the display panel 124. In this way, when the user uses a dismantling tool to force the hook 112 to separate the hook 112 from the display assembly 120, the dismantling tool functions on a position between the hook 112 of the main casing 110 and the side wall 1221 of the frame 122 without contacting the display panel 124, so that the display panel 124 may be prevented from being cracked due to the operation of the dismantling tool. In addition, positions of the main casing 110 and the display assembly 120 may be mutually limited by the position-limiting pillar 114 and the position-limiting block 116 adjacent to each other. In this way, the rigidity of the overall structure may be increased to prevent the display assembly 120 from being separated from the main casing 110 due to deformation of the main casing 110, so that it is unnecessary to design the main casing 110 to have a larger thickness in order to increase the rigidity of the main casing 110. In addition, by forming the hook 112 on the main casing 110 as described above instead of forming the hook on the frame 122, a width of the frame 122 may be reduced, which avails a narrow border design of the display device 100.

The hook 112 of the embodiment is located on an outer side the engaging portion 1222 and has a first appearance surface S1, and the side wall 1221 of the frame 122 has a second appearance surface S2. The first appearance surface S1 and the second appearance surface S2 extend along the front-rear direction D of the display device 100 and are flush with each other, so that the side of the display device 100 has a better appearance.

In the embodiment, one end 112a of the hook 112 of the main casing 110 abuts against the side wall 1221 and may be stably engaged with the engaging portion 1222 of the frame 122. In addition, the hook 112 has a notch N at the end 112a, and the notch N is adjacent to the side wall 1221 to facilitate the dismantling tool to apply force between the hook 112 and the side wall 1221. The notch N also provides an effect of beautifying the appearance at a junction of the hook 112 and the side wall 1221. In the embodiment, there may be a tiny gap between the engaging portion 1222 of the frame 122 and the hook 112 to provide a space required for the hook 112 to be deformed and separated from the engaging portion 1222.

Figure 4:
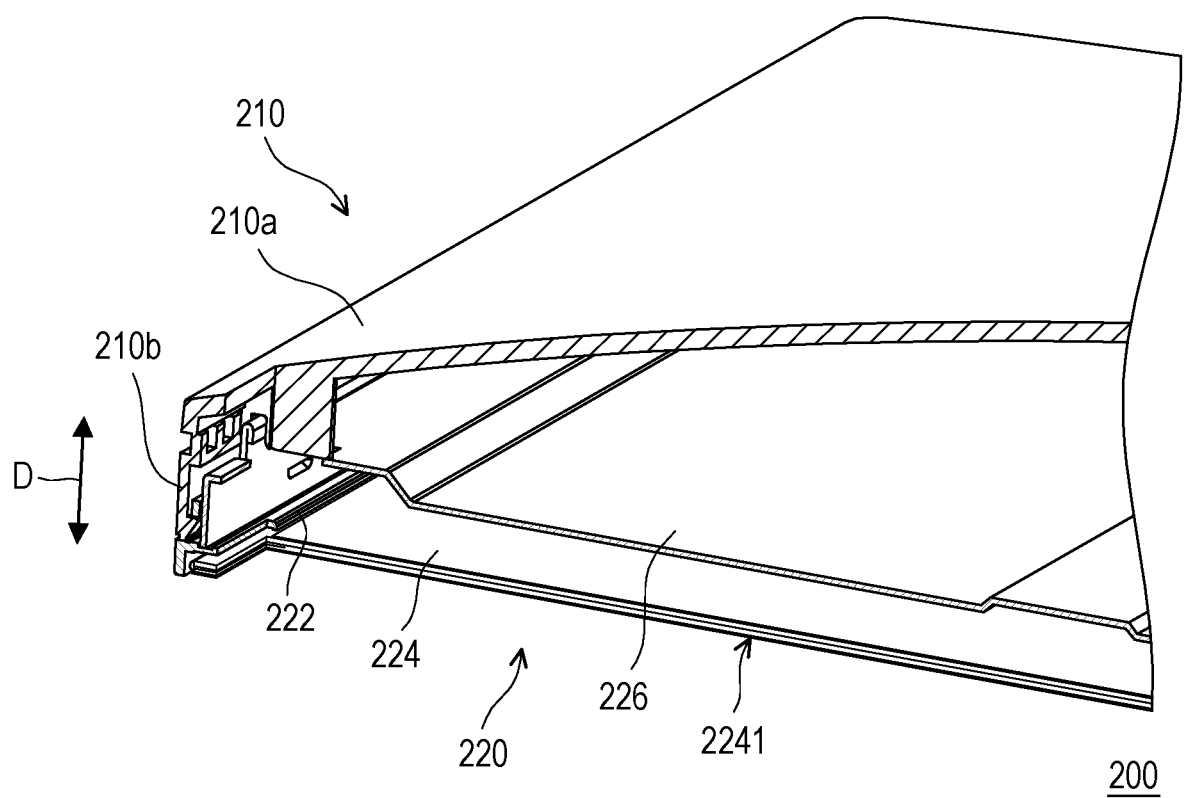
FIG. 4 is a three-dimensional view of some components of a display device according to another embodiment of the invention.

FIG. 4 is a three-dimensional view of some components of a display device according to another embodiment of the invention. Referring to FIG. 4, a display device 200 of the embodiment includes a main casing 210 and a display assembly 220. The main casing 210 includes a rear casing portion 210*a* and a side casing portion 210*b* connected to each other. The rear casing portion 210*a* shields a back surface of the display assembly 220. The display assembly 220 includes a frame 222, a display panel 224 and a back plate 226. The frame 222 is, for example, a plastic frame, the display panel 224 is, for example, a liquid crystal display panel and is disposed in the frame 222, and the back plate 226 is connected to the frame body 222 by means of engaging or other suitable means and is located between the frame 222 and the main casing 210. The display panel 224 has a display surface 2241, a front-rear direction D of the display device 200 is perpendicular to the display surface 2241, and the display surface 2241 faces the front of the display device 200 in the front-rear direction D.

Figure 5:
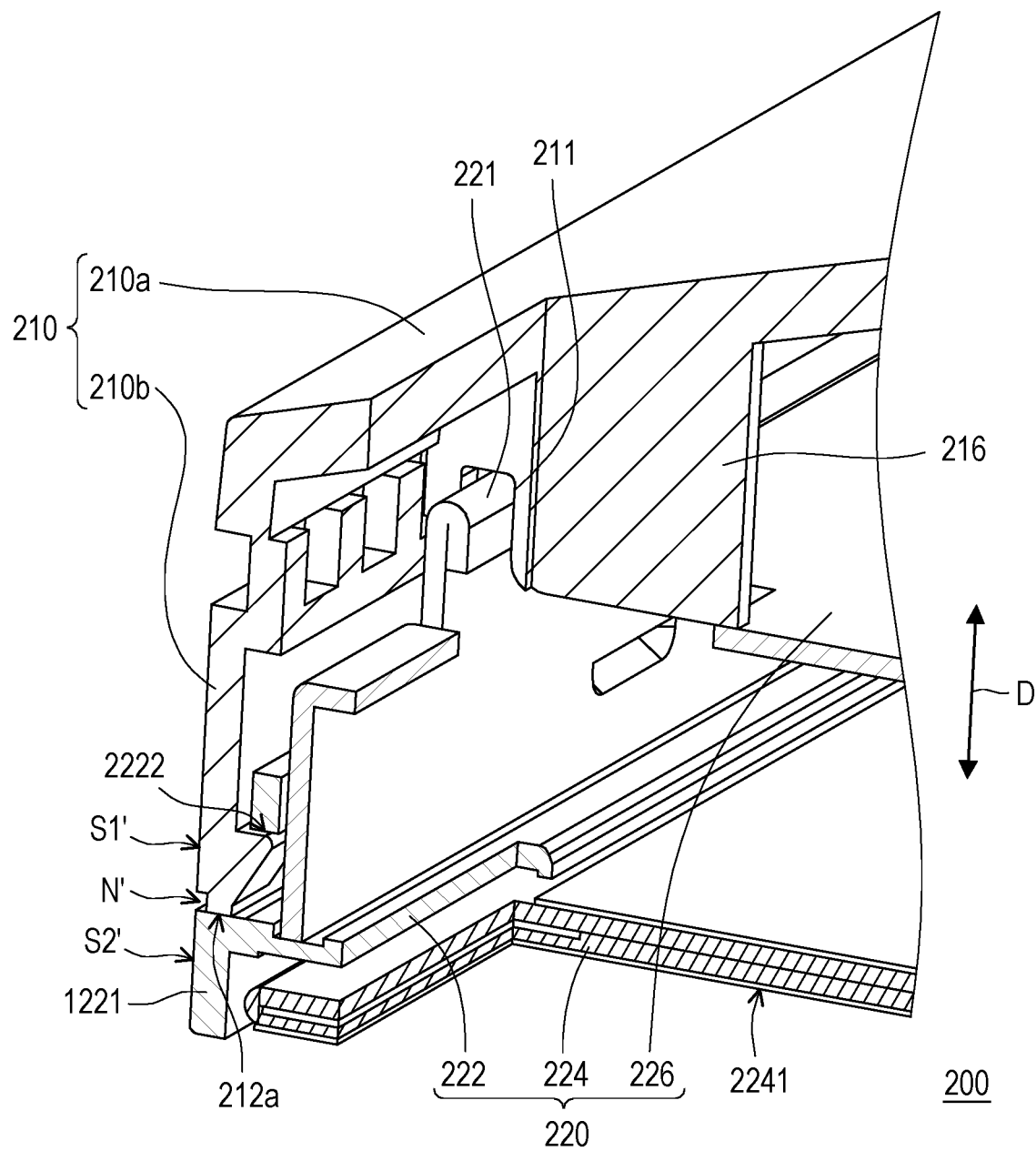
FIG. 5 is a partial enlarged view of the display device of FIG. 4.
Figure 6:
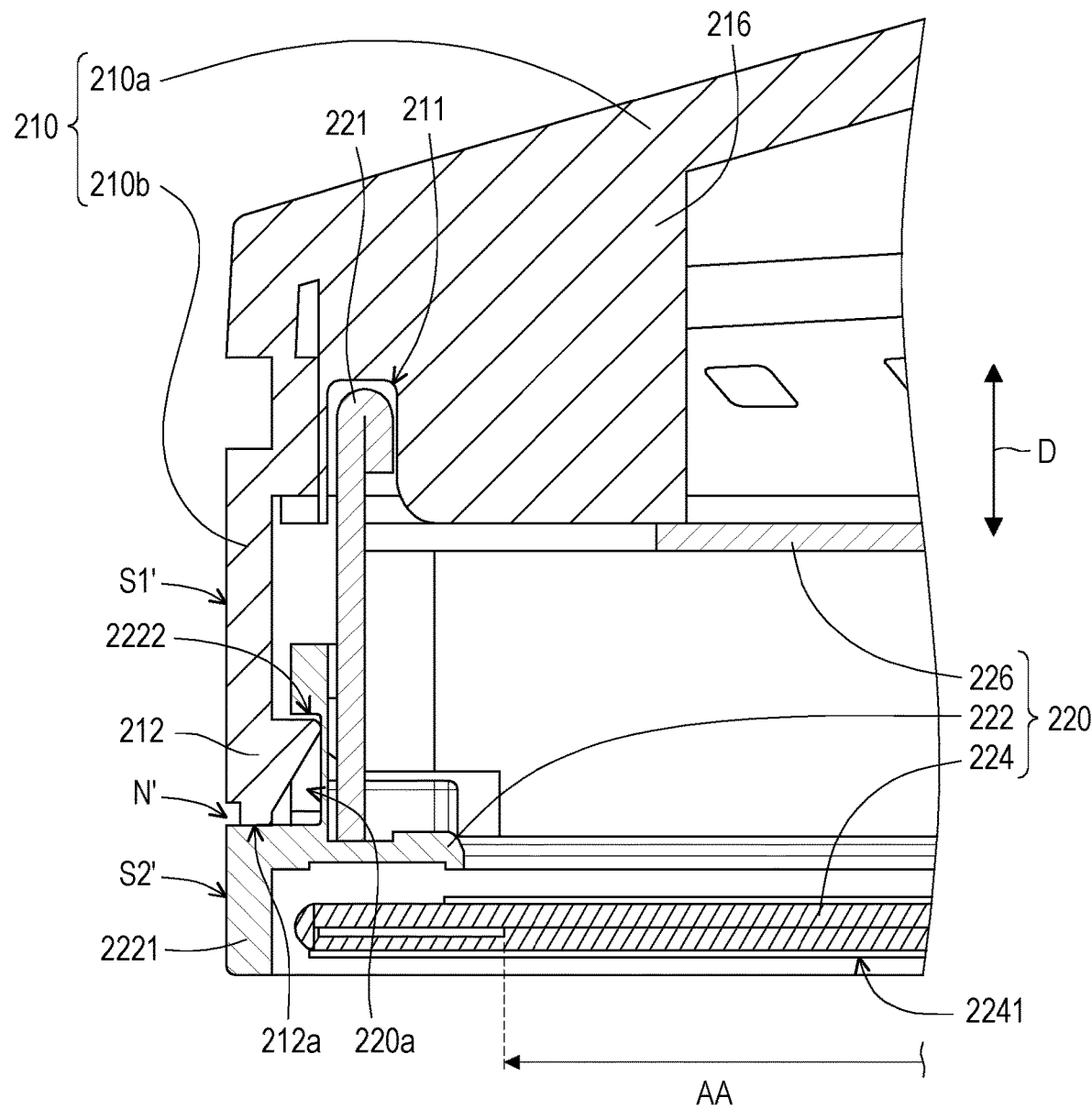
FIG. 6 is a partial cross-sectional view of the display device of FIG. 4.

FIG. 5 is a partial enlarged view of the display device of FIG. 4. FIG. 6 is a partial cross-sectional view of the display device of FIG. 4. Referring to FIG. 5 and FIG. 6, the main casing 210 of the embodiment has a hook 212. The frame 122 has a side wall 2221 and an engaging portion 2222. The engaging portion 2222 is, for example, an inner wall of an engaging groove 220*a* (marked in FIG. 6) of the frame 222. The side casing portion 210*b* of the main casing 210 extends from a periphery of the rear casing portion 210*a* to the side wall 2221 of the frame 222, the hook 212 is formed on the side casing portion 210*b*, and the side wall 2221 surrounds a periphery of the display panel 224. The engaging portion 2222 of the frame 222 and the hook 212 of the main casing 210 are located behind the side wall 2221 in the front-rear direction D of the display device 200, and the hook 212 extends into the engaging groove 220*a* and is engaged with the engaging portion 2222. The back plate 226 of the display assembly 220 has a position-limiting protrusion 221, where the position-limiting protrusion 221 does not overlap with a display area AA (marked in FIG. 6) of the display panel 224 in the front-rear direction D of the display device 200, so that the position-limiting protrusion 221 is closer to the hook 212, where the display area AA is, for example, an active area of the display panel 224. The rear casing portion 210*a* of the main casing 110 has a position-limiting groove 211. The position-limiting protrusion 221 of the display assembly 220 extends into the position-limiting groove 211 of the main casing 110 along the front-rear direction D of the display device 200.

As described above, the frame 222 of the display assembly 220 of the embodiment is added with the side wall 2221 surrounding the display panel 224, and the hook 212 of the main casing 210 is located behind the side wall 2221 and is not adjacent to the display panel 224. In this way, when the user uses the dismantling tool to force the hook 212 to separate the hook 212 from the display assembly 220, the dismantling tool functions on a position between the hook 212 of the main casing 210 and the side wall 2221 of the frame 222 without contacting the display panel 224, so that the display panel 224 may be prevented from being cracked due to the operation of the dismantling tool. In addition, positions of the display assembly 220 and the main casing 210 may be mutually limited by the position-limiting protrusion 221 adjacent to the hook 212. In this way, the rigidity of the overall structure may be increased to prevent the display assembly 220 from being separated from the main casing 210 due to deformation of the main casing 210, so that it is unnecessary to design the main casing 210 to have a larger thickness in order to increase the rigidity of the main casing 210. In addition, by forming the hook 212 on the main casing 210 as described above instead of forming the hook on the frame 222, a width of the frame 222 may be reduced, which avails a narrow border design of the display device 200.

In this embodiment, the main casing 210 further has a position-limiting block 216, and the position-limiting groove 211 is formed on the position-limiting block 216. The position-limiting block 216 leans against the back plate 226 of the display assembly 220 along the front-rear direction D to further increase the rigidity of the overall structure.

The hook 212 of the embodiment is located on an outer side the engaging portion 2222 and has a first appearance surface S1', and the side wall 2221 of the frame 222 has a second appearance surface S2'. The first appearance surface S1' and the second appearance surface S2' extend along the front-rear direction D of the display device 200 and are flush with each other, so that the side of the display device 200 has a better appearance.

In the embodiment, one end 212*a* of the hook 212 of the main casing 210 abuts against the side wall 2221 and may be stably engaged with the engaging portion 2222 of the frame 222. In addition, the hook 212 has a notch N' at the end 212*a*, and the notch N' is adjacent to the side wall 2221 to facilitate the dismantling tool to exert force between the hook 212 and the side wall 2221. The notch N' also provides an effect of beautifying the appearance at a junction of the hook 212 and the side wall 2221. In the embodiment, there may be a tiny gap between the engaging portion 2222 of the frame 222 and the hook 212 to provide a space required for the hook 212 to be deformed and separated from the engaging portion 2222.

In summary, in the display device of the invention, the side wall surrounding the display panel is added to the frame of the display assembly, and the hook of the main casing is located behind the side wall and is not adjacent to the display panel. Thereby, when the user uses a dismantling tool to exert a force on the hook to separate the hook from the display assembly, the dismantling tool functions on a position between the hook of the main casing and the side wall of the frame without contacting the display panel, so as to prevent the display panel from being cracked due to the function of the dismantling tool. In addition, the positions of the main casing and the display assembly may be mutually limited by the adjacent position-limiting pillar and position-limiting block, or the positions of the display assembly and the main casing may be mutually limited by the position-limiting protrusion located adjacent to the hook. Accordingly, the rigidity of the overall structure may be increased, and the display assembly may be prevented from being separated from the main casing due to deformation of the main casing, so that it is not necessary to design the main casing to have a larger thickness in order to increase the rigidity of the main casing.

What is claimed is:

1. A display device, comprising:
    a main casing, having a hook, a position-limiting pillar, and a position-limiting block, wherein the position-limiting block is adjacent to the position-limiting pillar; and
    a display assembly, comprising:
        a frame, having a side wall, wherein the hook is located behind the side wall along a front-rear direction of the display device and is engaged with the frame, the position-limiting pillar penetrates the display assembly along the front-rear direction, and the position-limiting block leans against the display assembly along the front-rear direction; and
        a display panel, disposed in the frame, wherein the side wall surrounds a periphery of the display panel,
        wherein the frame has an engaging portion engaged with the hook, wherein the engaging portion is located behind the side wall in the front-rear direction,
        wherein the hook has a notch at the end, and the notch is adjacent to the side wall and exposed at an outer side of the main casing.

2. The display device according to claim 1, wherein the display panel has a display surface, the front-rear direction is perpendicular to the display surface, and the display surface faces a front of the display device in the front-rear direction.

3. The display device according to claim 1, wherein the hook is located on an outer side of the engaging portion.

4. The display device according to claim 1, wherein the hook has a first appearance surface, the side wall has a second appearance surface, and the first appearance surface and the second appearance surface extend along the front-rear direction and are flush with each other.

5. The display device according to claim 1, wherein one end of the hook abuts against the side wall.

6. The display device according to claim 1, wherein the main casing comprises a rear casing portion and a side casing portion, the rear casing portion shields a back surface of the display assembly, the side casing portion extends from a periphery of the rear casing portion to the side wall, and the hook is formed on the side casing portion.

7. The display device according to claim 1, wherein the display assembly comprises a back plate, the back plate is connected to the frame and is located between the frame and the main casing, the back plate has a position-limiting hole, the position-limiting pillar penetrates the position-limiting hole along the front-rear direction, and the position-limiting block leans against the back plate along the front-rear direction.

8. A display device, comprising:
    a main casing, having a hook; and
    a display assembly, having a position-limiting protrusion, wherein the position-limiting protrusion extends into the main casing along a front-rear direction of the display device, and the display assembly comprises:
        a frame, having a side wall, wherein the hook is located behind the side wall in the front-rear direction and is engaged with the frame; and
        a display panel, disposed in the frame, wherein the side wall surrounds a periphery of the display panel, and the position-limiting protrusion does not overlap with a display area of the display panel in the front-rear direction,
        wherein the frame has an engaging portion engaged with the hook, wherein the engaging portion is located behind the side wall in the front-rear direction,
        wherein the hook has a notch at the end, and the notch is adjacent to the side wall and exposed at an outer side of the main casing.

9. The display device according to claim 8, wherein the display panel has a display surface, the front-rear direction is perpendicular to the display surface, and the display surface faces a front of the display device in the front-rear direction.

10. The display device according to claim 9, wherein the hook is located on an outer side of the engaging portion.

11. The display device according to claim 8, wherein the hook has a first appearance surface, the side wall has a second appearance surface, and the first appearance surface and the second appearance surface extend along the front-rear direction and are flush with each other.

12. The display device according to claim 8, wherein one end of the hook abuts against the side wall.

13. The display device according to claim 8, wherein the main casing comprises a rear casing portion and a side casing portion, the rear casing portion shields a back surface of the display assembly, the side casing portion extends from a periphery of the rear casing portion to the side wall, and the hook is formed on the side casing portion.

14. The display device according to claim 8, wherein the main casing has a position-limiting groove, and the position-limiting protrusion extends into the position-limiting groove along the front-rear direction.

15. The display device according to claim 14, wherein the main casing has a position-limiting block, the position-limiting groove is formed on the position-limiting block, and the position-limiting block leans against the display assembly along the front-rear direction.

16. The display device according to claim 8, wherein the display assembly comprises a back plate, the back plate is connected to the frame and is located between the frame and the main casing, and the position-limiting protrusion is formed on the back plate.

* * * * *